United States Patent
Cambou et al.

(10) Patent No.: US 9,218,879 B2
(45) Date of Patent: Dec. 22, 2015

(54) APPARATUS, SYSTEM, AND METHOD FOR MATCHING PATTERNS WITH AN ULTRA FAST CHECK ENGINE BASED ON FLASH CELLS

(75) Inventors: Bertrand F. Cambou, Palo Alto, CA (US); Neal Berger, Cupertino, CA (US); Mourad El Baraji, Fremont, CA (US)

(73) Assignee: Crocus Technology Inc., Sunnyvale, CA (US)

(*) Notice: Subject to any disclaimer, the term of this patent is extended or adjusted under 35 U.S.C. 154(b) by 1055 days.

(21) Appl. No.: 13/309,475

(22) Filed: Dec. 1, 2011

(65) Prior Publication Data
US 2012/0143554 A1   Jun. 7, 2012

Related U.S. Application Data

(60) Provisional application No. 61/418,822, filed on Dec. 1, 2010.

(51) Int. Cl.
 G11C 16/06   (2006.01)
 G11C 15/04   (2006.01)
 G11C 16/04   (2006.01)

(52) U.S. Cl.
 CPC .......... G11C 15/046 (2013.01); G11C 16/0483 (2013.01)

(58) Field of Classification Search
 USPC ................ 365/185.25, 185.2, 185.21, 189.17
 See application file for complete search history.

(56) References Cited

U.S. PATENT DOCUMENTS

| | | | |
|---|---|---|---|
| 4,532,438 A | 7/1985 | Reiner | |
| 4,899,154 A | 2/1990 | Colles | |
| 5,589,785 A | 12/1996 | Garavan | |
| 6,370,061 B1* | 4/2002 | Yachareni et al. | 365/185.22 |
| 6,542,409 B2* | 4/2003 | Yamada | 365/185.2 |
| 6,873,551 B2 | 3/2005 | Bedarida et al. | |
| 7,082,056 B2* | 7/2006 | Chen et al. | 365/185.2 |
| 7,342,832 B2* | 3/2008 | Lee et al. | 365/185.25 |
| 7,483,305 B2* | 1/2009 | Yamada | 365/185.2 |
| 2009/0190404 A1 | 7/2009 | Roohparvar | |
| 2011/0249480 A1 | 10/2011 | Cho | |

FOREIGN PATENT DOCUMENTS

WO   2006043237 A2   5/2006

OTHER PUBLICATIONS

International Search Report and Written Opinion issued to International Patent Application No. PCT/US2011/062949, May 29, 2012, 8 pgs.
Miwa et al., "A 1-Mb 2-Tr/b Nonvolatile CAM Based on Flash Memory Technologies", IEEE Journal of Solid State Circuits, vol. 31, No. 11, Nov. 1996, pp. 1601-1609.
Partial Supplementary Search Report issued to European Patent Application No. 11 84 4127, Feb. 27, 2015, 7 pgs.

* cited by examiner

Primary Examiner — Pho M Luu
(74) Attorney, Agent, or Firm — Cooley LLP (57) ABSTRACT

A check engine includes comparators, where each comparator has flash cells. Each comparator is configured to store at least one reference bit included in a set of reference bits defining a first pattern. Each comparator also includes an input for presenting at least one target bit included in a set of target bits defining a second pattern. Each comparator is configured to produce an output representing a level of matching between the at least one target bit and the at least one reference bit. The check engine is configured such that the outputs of the comparators are combined to produce a combined output that is compared to a reference signal to determine whether there is a match between the first pattern and the second pattern.

23 Claims, 11 Drawing Sheets

Comparison: Pattern match with Memory Based System Versus Check Engine

|     | DATA<1:0> | | | |
| --- | --- | --- | --- | --- |
|     | 00 | 01 | 10 | 11 |
| M1  | 1  | 0  | 1  | 0  |
| M2  | 0  | 1  | 0  | 1  |
| M3  | 1  | 1  | 0  | 0  |
| M4  | 0  | 0  | 1  | 1  |

|     | DATA<1:0> | | | |
| --- | --- | --- | --- | --- |
|     | 00 | 01 | 10 | 11 |
| M1 | 0 | 1 | 0 | 1 |
| M2 | 1 | 0 | 1 | 0 |
| M3 | 0 | 0 | 1 | 1 |
| M4 | 1 | 1 | 0 | 0 |

8bit serial architecture:

>Check input 8 bits (k1, k2, k3, k4, k5, k6, k7, k8)
>Versus stored 8 bits (s1, s2, s3, s4, s5, s6, s7, s8)

Example: We will check the pattern (0,1,1,0,1,0,0,1)

1-Check all "0's".
>Apply all known "0's" to their respective slot (here: k1, k4, k6, k7)
>Read the end resistance
2- If necessary check all "1's".
>Apply all known "1's" to their respective slot (here: k2, k3, k5, k8)
>Read the end resistance

APPARATUS, SYSTEM, AND METHOD FOR MATCHING PATTERNS WITH AN ULTRA FAST CHECK ENGINE BASED ON FLASH CELLS

CROSS-REFERENCE TO RELATED APPLICATION

The present application claims the benefit of U.S. Provisional Application No. 61/418,822, filed on Dec. 1, 2010, the disclosure of which is incorporated herein by reference in its entirety.

FIELD OF THE INVENTION

The invention relates generally to pattern checking and, more particularly, to an apparatus, system, and method for matching patterns with an ultra fast check engine based on flash cells.

BACKGROUND

Figure 1A:
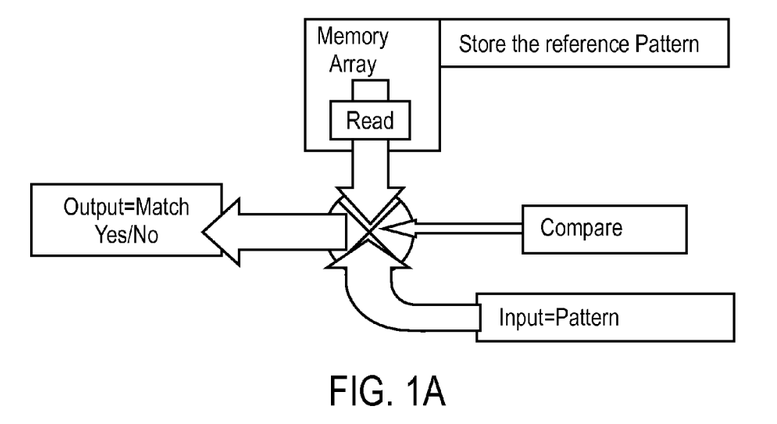
FIG. 1A illustrates a conventional memory-based system to perform pattern checking.

Memory technologies can be used to store information in the form of patterns. To check that a stored pattern (e.g., a reference pattern) matches a pattern provided at some input terminal (e.g., a target pattern), it is typical to first read the reference pattern and then compare the target pattern with the reference pattern. Comparison of the target pattern with the reference pattern can yield a "yes" or a "no" matching level. FIG. 1A illustrates a conventional memory-based system to perform pattern checking. Referring to FIG. 1A, a reference pattern is stored in a memory array, and, in order to perform a comparison with a target pattern, the reference pattern is first read from the memory array. Reading the reference pattern from the memory array takes at least a few clock cycles and introduces undesirable latencies into the system. Also, comparison between the target pattern and the reference pattern is typically performed in another part of the system that is separate from the memory array, such as a crypto-processor section. As a result, the reference pattern (once read from the memory array) has to be conveyed to another part of the system, such as via a data bus. Conveyance of the reference pattern not only introduces additional latencies but also renders the reference pattern susceptible to interception or tampering while in transit.

It is against this background that a need arose to develop the apparatus, system, and method described herein.

SUMMARY

Embodiments of the invention relate to an apparatus, system, and method for matching a target pattern to a previously stored reference pattern with an ultra fast check engine based on flash cells. A result of the comparison can yield a "yes" or a "no" matching level, such as for purposes of security, authentication, and a number of other applications. Advantageously, the comparison between the target pattern and the reference pattern can be performed in situ within a check engine including the flash cells, without requiring a read operation for the reference pattern, and without requiring conveyance of the reference pattern to another part of the system. As a result, the comparison can be performed in a short time, such as about 100 ns or less, while maintaining the reference pattern within the check engine so as to reduce its exposure to interception or tampering.

In one embodiment, the check engine includes a plurality of comparators, each including a plurality of flash cells, where each of the plurality of comparators is configured to store at least one reference bit included in a set of reference bits, and includes an input for presenting at least one target bit included in a set of target bits. Each of the plurality of comparators is configured to produce an output representing a level of matching between the at least one target bit and the at least one reference bit. The check engine is configured such that the outputs of the plurality of comparators are combined to produce a combined output. The check engine is configured to determine that the set of target bits matches the set of reference bits based on the combined output of the plurality of comparators.

In one embodiment, a method of operating a check engine includes: (1) providing a plurality of comparators in the check engine, each including a plurality of flash cells; (2) storing at least one reference bit included in a set of reference bits in each of the plurality of comparators; (3) presenting at least one target bit included in a set of target bits to each of the plurality of comparators; (4) generating an output of each of the plurality of comparators, the output representing a level of matching between the at least one target bit and the at least one reference bit; (5) combining the outputs of the plurality of comparators to produce a combined output; and (6) determining that the set of target bits matches the set of reference bits based on the combined output of the plurality of comparators.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining. Adjacent objects can be spaced apart from one another or can be in actual or direct contact with one another. In some instances, adjacent objects can be formed integrally with one another.

As used herein, the terms "connect," "connected," and "connection" refer to an operational coupling or linking. Connected objects can be directly coupled to one another or can be indirectly coupled to one another, such as via another set of objects.

Ultra Fast Check Engine

Figure 1B:
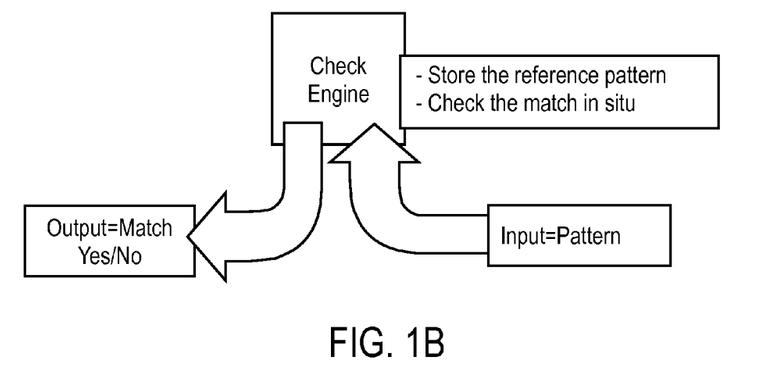
FIG. 1B illustrates an ultra fast check engine that allows for direct and in situ pattern checking, according to an embodiment of the invention.

FIG. 1B illustrates an ultra fast check engine that allows for direct and in situ pattern checking, according to an embodiment of the invention. The check engine can be implemented or made available under the designation of "Match-In-Place" (or "MIP" or "M.I.P."). The check engine addresses and overcomes the deficiencies of conventional memory-based systems, and has at least the following advantages:

(1) Faster response time to yield a "yes" or a "no" matching level, in which a single bit or a series of bits can be checked within about 100 ns or less.
(2) Enhanced security since a stored reference pattern need not be read and need not be conveyed through a data bus to another part of the system.
(3) Faster programming of stored reference patterns, in which a single bit or a series of bits can be written within about 100 ns or less. In contrast, programming cycles can take about 200 times longer with conventional non-volatile memories.
(4) Lends itself to zero knowledge proof architectures and techniques, such as where an entire pattern need not be checked to yield a "yes" or a "no" matching level with a high confidence.
(5) Allows lower cost system solutions since a compare function is directly integrated within the check engine, thereby obviating separate circuitry to implement such a compare function.

Figure 2:
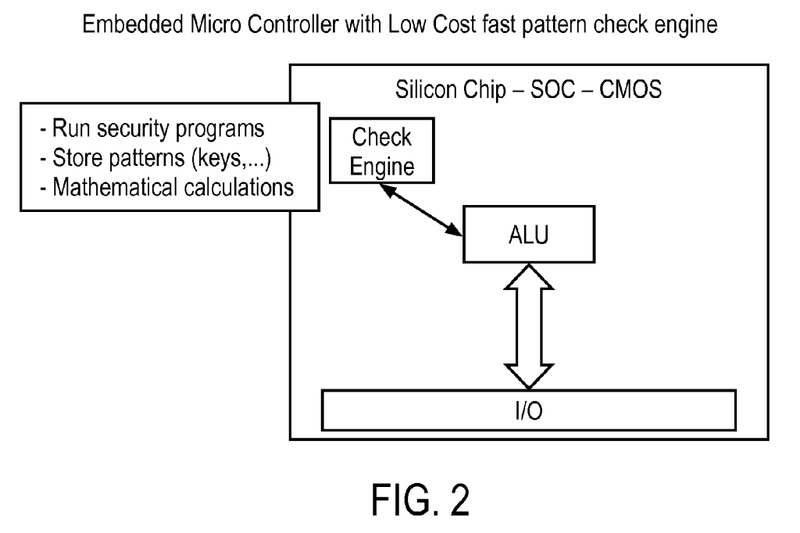
FIG. 2 illustrates a system on chip ("SOC") in which a check engine is embedded as part of the SOC, according to an embodiment of the invention.

FIG. 2 illustrates a system on chip ("SOC") in which a check engine is embedded as part of the SOC, according to an embodiment of the invention. Referring to FIG. 2, the check engine operates in conjunction with an arithmetic logic unit ("ALU"), or any other microcontroller, to run a security program, store and compare patterns, perform mathematical calculations, or any of a number of other applications. Advantageously, manufacturing operations for the check engine are compatible with a number of complementary metal-oxide-semiconductor ("CMOS") manufacturing processes. Specifically, the check engine can be manufactured by including a few additional wafer processing layers, after a basic CMOS process and before an assembly process. Although FIG. 2 illustrates the check engine as part of the SOC, it is contemplated that the check engine can be implemented in a number of other ways, such as part of a separate chip, as a dedicated circuitry to perform pattern checking, as part of the ALU, as part of a system in package, and so forth.

Applications of Ultra Fast Check Engine

Embodiments of a check engine can be advantageously used in a number of applications involving a comparison between a target pattern and a reference pattern, whether for purposes of pattern matching, pattern recognition, pattern mining, pattern searching, or other purposes. For example, a check engine can be included within, or can operate in conjunction with, a smart card, a bank card, or another portable device to implement a security function (e.g., by checking patterns corresponding to security passwords, electronic keys, and cryptographic keys or by implementing zero knowledge proof techniques), an authentication function (e.g., by checking patterns to verify the identity of a bearer of the smart card), to facilitate commercial transactions (e.g., by checking patterns for electronic payment and electronic ticketing), and so forth. When implemented within smart cards or other portable devices, a check engine can operate in conjunction with Near Field Communication ("NFC") or another wireless communication technology to allow input of target patterns and exchange of data. As an additional example, a check engine can be included within, or can operate in conjunction with, an identity document (e.g., an electronic passport, a driver's license, or an electronic identity card) to implement an authentication function (e.g., by checking patterns to verify the identity of a bearer of an electronic passport or to verify the authenticity of the electronic passport). As further examples, a check engine can be used to implement object navigation and tracking (e.g., by checking patterns corresponding to position or angular coordinates), mathematical calculations, data compression, cache tags, and networking functions (e.g., Ethernet address lookup, address filtering, and lookup of routing information in the context of switches, firewalls, bridges, routers, and other networking devices).

Figure 3:
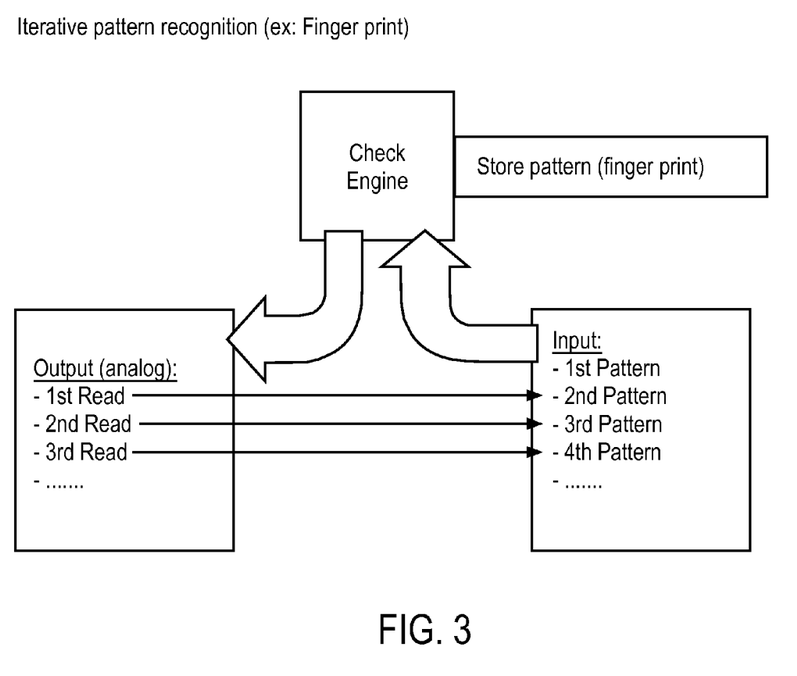
FIG. 3 illustrates one application of a check engine implemented as part of an iterative process in accordance with an embodiment of the invention.

For certain applications, such as fingerprint recognition, a pattern may change slightly overtime, such as due to dry skin, finger cuts, dirt, varying angles at which the pattern is obtained, and so forth. Because a check engine can produce an analog output to measure the level of matching or the quality of a match, this analog output can be processed as part of an iterative process as illustrated in FIG. 3 in accordance with an embodiment of the invention. Specifically, a feedback loop links an output to a modification of an input (e.g., a small change in the shape or position of a pattern or the angle at which the pattern is obtained), thereby allowing the system to rapidly converge towards a decision of "yes" or "no". A similar iterative process can be applied in the context of object navigation and tracking, such as in a robotic environment to move an arm or another part of a robot to a desired position or orientation.

Single-Bit Architecture of Ultra Fast Check Engine Based on Flash Cells

Figure 4:
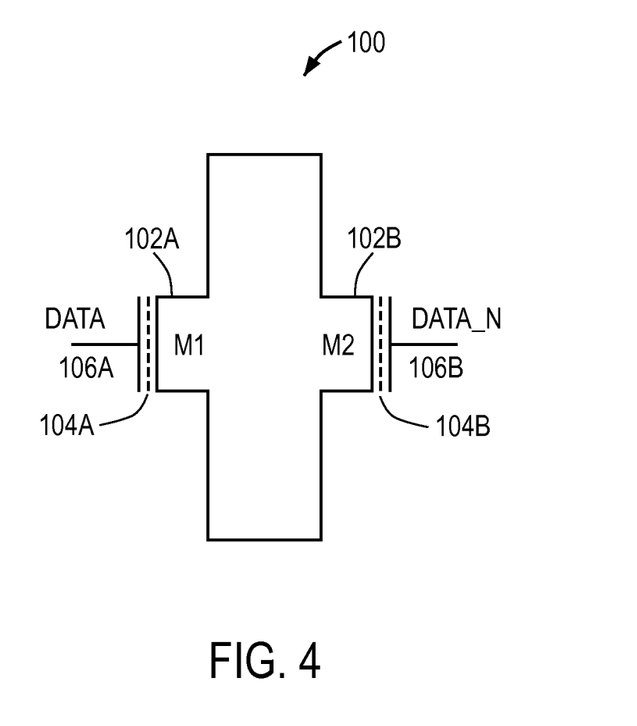
FIG. 4 illustrates a comparator that can be included in a check engine, according to an embodiment of the invention.

FIG. 4 illustrates a comparator 100 that can be included in a check engine, according to an embodiment of the invention. In the embodiment illustrated in FIG. 4, the comparator 100 includes a pair of flash cells 102A-102B connected in parallel. Alternatively, it is contemplated that for other embodiments the comparator 100 may include the pair of flash cells 102 connected in series. It is also contemplated that the comparator 100 may include three or more flash cells connected in parallel or in series. The comparator 100 may be digital or analog. It is contemplated that the flash cells 102 may be flash EEPROM or flash EPROM cells. Alternatively, the comparator 100 may include other types of memory cells. Although one comparator 100 is illustrated in FIG. 4, it is contemplated that multiple comparators 100 can be included in the check engine. As described with reference to FIGS. 5 through 8, the multiple comparators 100 may be connected in parallel or in series.

Referring to FIG. 4, each flash cell 102 is a flash transistor (e.g., floating gate transistor or another type of charge trapping transistor). The data stored in flash cells 102A and 102B is represented by M1 and M2, respectively. When reading the data stored in the flash cells 102, a magnitude of a voltage applied to the floating gate 104 can be at or above a threshold voltage $V_t$ (e.g., $|V_{applied}| > V_t$, with $V_{applied}$ being positive in the case of NMOS and negative in the negative of PMOS). During the read, each flash cell 102 can be implemented so as to be substantially conductive from a source to a drain if the floating gate 104 has substantially no charge trapped on the floating gate 104. Also, during the read, each flash cell 102 can be implemented so as to be substantially non-conductive from the source to the drain if the floating gate 104 has sufficient charge trapped on the floating gate 104, such as substantially full negative charge trapped on the floating gate 104. In addition, each flash cell 102 can be implemented so as to be substantially nonconductive from a source to a drain when a magnitude of a voltage applied to the floating gate 104 is below $V_t$ (e.g., $|V_{applied}| < V_t$), regardless of whether there is charge trapped in the floating gate 104.

In one embodiment, each data value stored by the comparator 100 corresponds to a first charge state stored in the flash cell 102A and a second, opposite charge state stored in the flash cell 102B. When programming the comparator 100 to store a "0", the first cell 102A can remain uncharged (M1 is "0"), while the second cell 102B can be charged (M2 is "1"). When programming the comparator 100 to store a "1", the first cell 102A can be charged (M1 is "1"), while the second cell 102B can remain uncharged (M2 is "0"). Other programming schemes are contemplated, such as by inverting the applied charges to the first flash cell 102A and the second flash cell 102B from that explained above.

During pattern matching, a "0" can be presented for comparison with the data value stored in the comparator 100 by applying a high voltage (e.g., $|V_{applied}| > V_t$) on a first input line 106A crossing the first flash cell 102A, while, in conjunction, a low voltage (e.g., $|V_{applied}| < V_t$) is applied on a second input line 106B crossing the second flash cell 102B. A "1" can be presented for comparison with the data value stored in the comparator 100 by applying a low voltage (e.g., $|V_{applied}| < V_t$) on the first input line 106A, while, in conjunction, a high voltage (e.g., $|V_{applied}| > V_t$) is applied on the second input line 106B. In one embodiment, a resulting combined resistance of the two cells 102A and 102B in parallel is a low value when there is a match (e.g., when at least one of the cells 102 is in its electrically conductive state), and is a high value when there is a mismatch (e.g., when both of the cells 102 are in their nonconductive states). In another embodiment, a resulting combined resistance of the two cells 102A and 102B in parallel is a high value when there is a match (e.g., when both of the cells 102 are in their nonconductive states), and is a low value when there is a mismatch (e.g., when at least one of the cells 102 is in its electrically conductive state). Other pattern matching schemes are contemplated, such as by inverting the applied voltages to the first flash cell 102A and the second flash cell 102B from that explained above.

Programming of the flash-based comparator 100 of FIG. 4 is typically slower than that of a magnetic cell such as a magnetic random access memory (MRAM) cell, with programming of the flash-based comparator 100 taking place in about 1 μs, and pattern checking taking place in about 100 ns. However, a difference in resistance between a match and a mismatch can be at least a few orders of magnitude greater than that of a magnetic cell, thereby providing an improved resolution of resistance and allowing concurrent operation of a large number of flash-based comparators 100 and massively parallel pattern checking. For example, the resistance of a flash cell 102 may be about 100 MΩ in its electrically nonconductive state, and may be in the range from about 10 KΩ to about 100 KΩ in its conductive state.

Logical Block Diagram of Ultra Fast Check Engine

Figure 9:
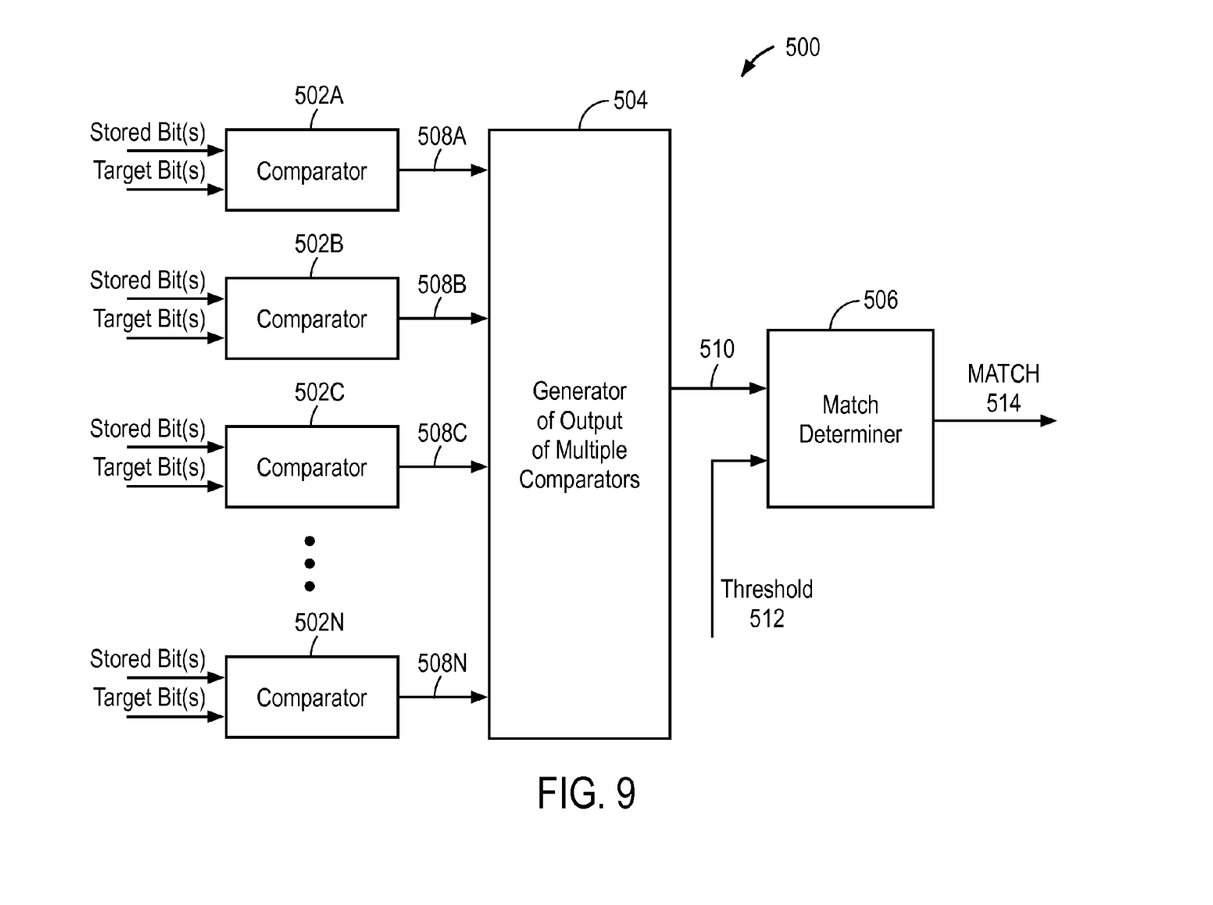
FIG. 9 illustrates a logical block diagram of a check engine, according to an embodiment of the invention.

FIG. 9 illustrates a logical block diagram of a check engine 500, according to an embodiment of the invention. The check engine 500 includes one or more comparators 502A-502N, a generator 504 of an output of the comparators 502, and a match determiner 506. As described with reference to FIG. 4, each of the comparators 502 (which may correspond to the comparators 100) stores one or more reference bits and receives one or more target bits, and generates an output 508 that represents a level of matching between the one or more target bits and the one or more reference bits. The outputs 508A-508N of the comparators 502A-502N are provided to the generator 504. The generator 504 may generate an output 510 based on the outputs 508A-508N of the individual comparators 502A-502N. The output 510 of the generator 504 may represent a level of matching across the comparators 502. The output 510 may then be provided to a match determiner 506, which may compare the output 510 to a threshold 512 to determine a match output 514. The match output 514 may represent a determination by the check engine 500 as to whether the reference pattern stored in the comparators 502 matches the target pattern applied to the comparators 502.

In one embodiment, the generator 504 may evaluate the individual outputs 508A-508N to determine how many of the comparators 502A-502N individually detected a match. Alternatively, the generator 504 may aggregate (combine) the outputs 508A-508N. The output 510 may correspond to a number of the comparators 502 that individually detected a match, or a percentage of the comparators 502 that individually detected a match.

In one embodiment, the threshold 512 may be set such that a match is determined (e.g., the match output 514 is asserted) when not all of the bits of the target pattern match corresponding bits of the reference pattern, e.g., one or more bits of the target pattern does not match a corresponding one or more bits of the reference pattern. This type of processing may be helpful for applications such as fingerprint matching where identifying a "perfect" match can be less important that other applications. In another embodiment, the threshold 512 may be set such that a match is determined when all of the bits of the target pattern match the corresponding one or more bits of the reference pattern.

Multi-Bit Serial Architecture of Ultra Fast Check Engine

Figure 10:
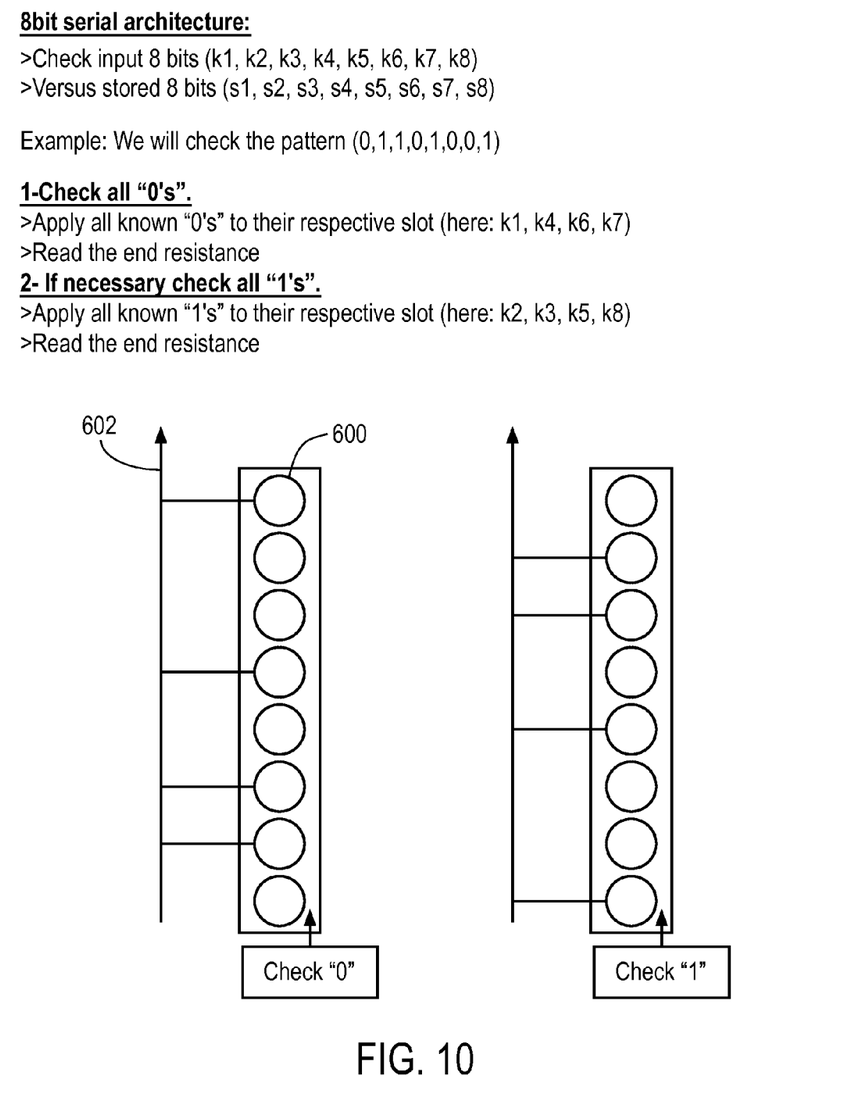
FIG. 10 illustrates multiple comparators that can be included in a check engine, according to an embodiment of the invention.

FIG. 10 illustrates multiple comparators 600 that can be included in a check engine, according to an embodiment of the invention. Similar to the comparator of FIG. 4, each comparator 600 of FIG. 12 is a single-bit cell that can be used to store and compare a single-bit data value. 8 comparators 600 are included to allow checking of 8-bit patterns, although it is contemplated that more or less comparators can be included in the check engine. Here, the comparators 600 are connected together through a common input line 602 shared by the comparators 600.

In the illustrated embodiment, "0's" and "1's" of a target pattern are checked in separate cycles. In one cycle, all "0's" of the target pattern are checked concurrently by presenting a "0" through the input line 602 and selecting particular ones of the comparators 600 (which are candidates for storing "0's") through, for example, their respective selection transistors. A result of checking for "0's" can account for an output of each selected comparator 600, or can correspond to an aggregate of some, or all, of the outputs of the selected comparators 600. For example, the result can be a "yes" if there is a positive match for each selected comparator 600, and can be a "no" otherwise. As another example, the result can be a "yes" if there is a positive match for at least a particular percentage of the selected comparators 600, and can be a "no" otherwise. If the result of checking for "0's" is a "no", a next cycle to check "1's" can be skipped. Also, even if all "0's" are checked as a "yes", a decision can be made to skip the next cycle and assert that a match is statistically likely. If a higher level of certainty is desired, all "1's" can be checked concurrently in the next cycle by presenting a "1" through the input line 602 and selecting particular ones of the comparators 600 (which are candidates for storing "1's") through, for example, their respective respective selection transistors. An overall result of checking can be available within about 100 ns or less if only "0's" are checked, and within about 2×100 ns if both "0's" and "1's" are checked in successive cycles.

The architecture of FIG. 10 can be extended for the design of 16-bit, 32-bit, 64-bit, 128-bit, and higher bit serial architectures by including additional comparators along the input line, such as by including 16 comparators for a 16-bit design. If a higher level of certainty is desired for a positive match, the number of bits to be checked concurrently can be set lower than when a lower level of certainty is sufficient. Depending upon the particular implementation, a large number of bits checked concurrently can have a lower level of certainty due to a degraded signal-to-noise ratio. For fingerprint recognition, as an example, a relatively large number of bits can be checked concurrently, since identifying a "perfect" match can be less important that other applications. In the case of checking electronic keys, a large key can be parsed and segmented into smaller increments that are separately checked to allow a higher level of certainty.

Multi-Bit Serial Architecture of Ultra Fast Check Engine Using Opposite Bits

Figure 11:
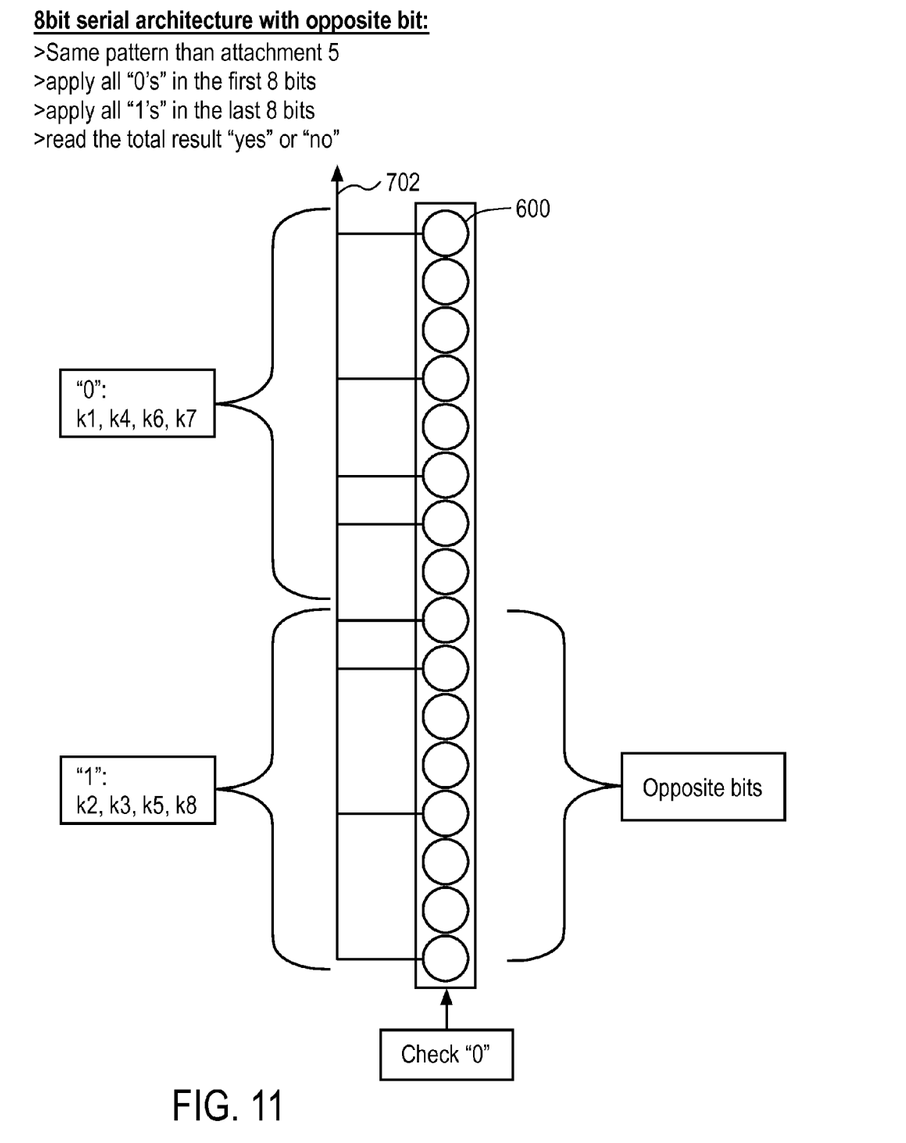
FIG. 11 illustrates multiple comparators that can be included in a check engine, according to an embodiment of the invention.

FIG. 11 illustrates multiple comparators 600 that can be included in a check engine, according to another embodiment of the invention. Similar to the comparator of FIG. 5, each comparator 600 of FIG. 13 is a single-bit cell that can be used to store and compare a single-bit data value. Referring to FIG. 13, 16 comparators 600 are included to allow checking of all "0's" and all "1's" of an 8-bit target pattern in a single cycle. Specifically, an 8-bit reference pattern is programmed in a first group of 8 comparators 600 (e.g., the first 8 comparators 600 along an input line 702), and the ones' complement of the 8-bit reference pattern (namely, where all "0's" are replaced by "1's" and vice versa) is programmed in a second group of 8 comparators 600 (e.g., the next 8 comparators 600 along the input line 702). In such manner, all "0's" and all "1's" of a target pattern can be checked concurrently in a single cycle, by presenting a "0" through the input line 702 and selecting particular ones of the comparators 600 in the first group of 8 comparators 600 (which are candidates for storing "0's") and selecting particular ones of the comparators 600 in the second group of 8 comparators 600 (which are candidates for storing "1's"). A result of checking can be available within about 100 ns or less.

The architecture of FIG. 11 can be extended for the design of 16-bit, 32-bit, 64-bit, 128-bit, and higher bit serial architectures by including additional comparators along the input line, such as by including 32 comparators for a 16-bit design. Although a footprint area of the architecture of FIG. 11 can be about twice that of the architecture of FIG. 10, the architecture of FIG. 11 allows pattern checking to be performed about twice as fast, while providing a high level of certainty. The architecture of FIG. 11 can be desirable for security applications such as checking of electronic keys.

Multi-Bit Serial Architecture for Matching Patterns

Figure 5:
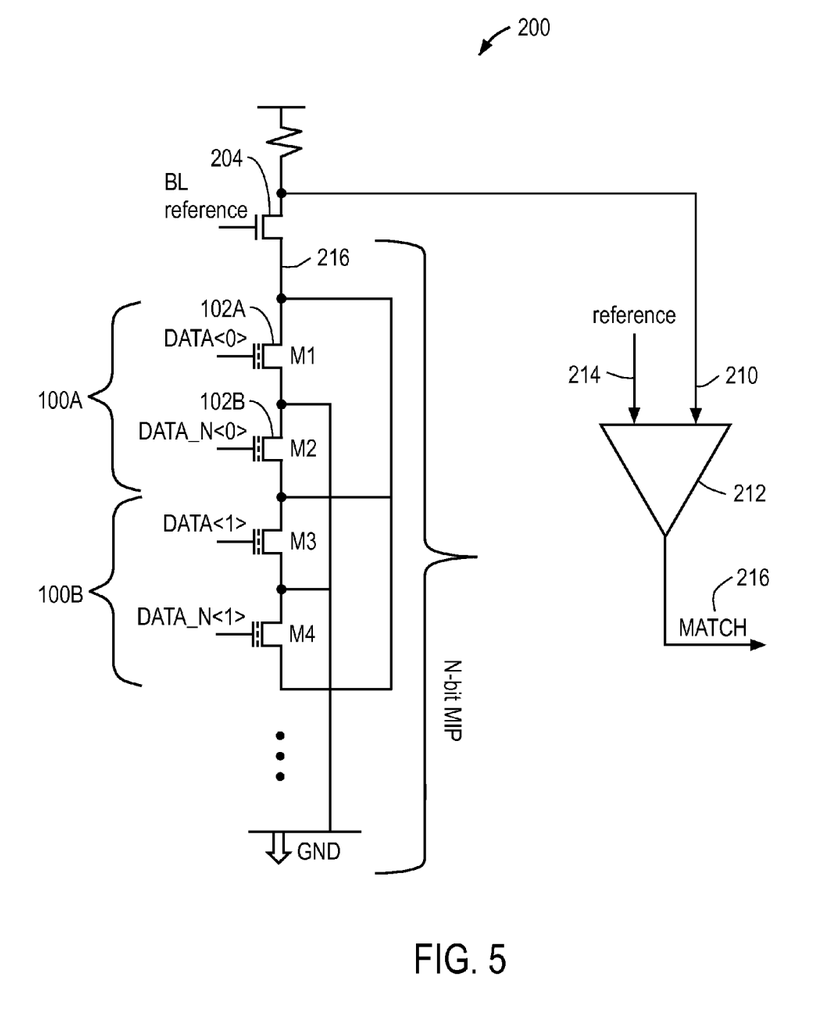
FIG. 5 illustrates a check engine including comparators connected in parallel, according to an embodiment of the invention.

FIG. 5 illustrates a check engine 200 including comparators 100 (100A and 100B shown) connected in parallel, according to an embodiment of the invention. Characteristics of each comparator 100 have been described with reference to FIG. 4. Referring to FIG. 5, N comparators, where N is at least 2, are included to allow checking of N-bit patterns.

The check engine 200 of FIG. 5 has a serial architecture for match-in-place (MIP) applications. In MIP applications, an N-bit target pattern, including DATA<0> and DATA<1> as two of the bits, is compared to an N-bit stored pattern. The target pattern and the stored pattern may be binary patterns. In one embodiment, one distinct bit of the N-bit stored pattern is stored in each of the comparators 100. The stored bit of each comparator 100 may be stored in a pair of flash cells 102 (such as flash cells 102A and 102B, with reference to FIG. 4) included in each comparator 100. Each comparator 100 performs a comparison of its stored bit to a corresponding bit of the N-bit target pattern. As described previously, in a pattern checking mode, the comparator acts as a two terminal device, namely a "0" or a "1" is presented at an input of the comparator, and a response of "yes" (match) or "no" (no match) based on the comparison is presented at an output of the comparator. As described previously with reference to FIG. 4, a "0" or a "1" can be presented to each comparator 100 by applying a DATA bit and an opposite DATA_N bit to its flash cells 102A and 102B, respectively.

In one embodiment, the comparators 100 may be connected to a common bit line 216 for application of current to the comparators 100. Application of current may be controlled by a transistor 204 or another device, such as a switch, configured to allow current to flow (when in a saturated mode) to the comparators 100. In another embodiment, multiple transistors or switches may separately control application of current to subsets of the comparators 100.

As described previously with reference to FIG. 4, the output of each comparator 100 can be analog in nature. For example, in the embodiment of FIG. 5, a high resistance value (e.g., about 100 MΩ, though the resistance is not restricted to this value) can be presented for a match, and a low resistance value (e.g., in the range from about 10 KΩ to 100 KΩ, though the resistance is not restricted to this value) can be presented for a mismatch.

Figure 6:
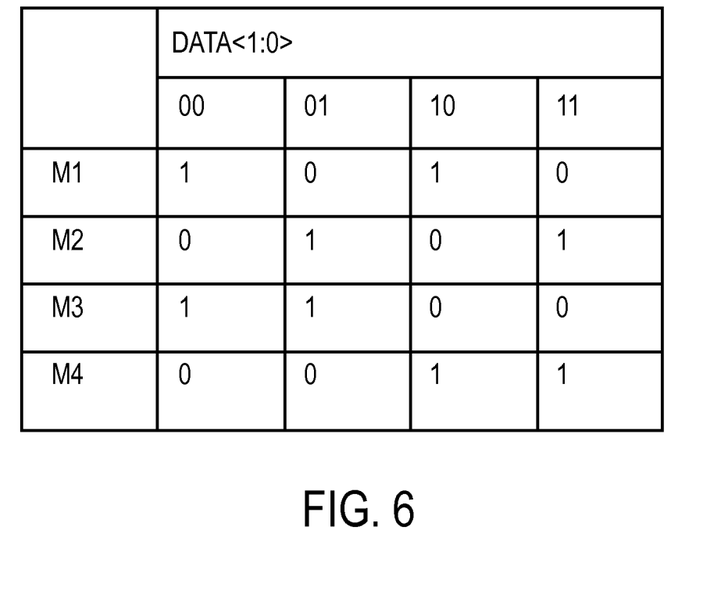
FIG. 6 illustrates matches between data stored in the check engine of FIG. 5 and target data, according to an embodiment of the invention.

FIG. 6 illustrates matches between data stored in the check engine 200 of FIG. 5 (such as M1, M2, M3, M4) and target data (such as DATA<1:0>), according to an embodiment of the invention. Each combination of DATA<0> and (M1, M2) shown in FIG. 6 corresponds to both flash cells 102 included in the comparator 100A being in their nonconductive states. Similarly, each combination of DATA<1> and (M3, M4) shown in FIG. 6 corresponds to both flash cells 102 included in the comparator 100B being in their nonconductive states.

Referring to FIG. 5, outputs of the comparators 100 can be combined to create a combined output. In one embodiment, the combined resistance of the comparators 100 connected in parallel can be determined from the resistances of the individual comparators 100 in a manner known to one of ordinary skill in the art. In an illustrative example, if there are twenty comparators 100 connected in parallel and the resistance of each comparator 100 corresponding to a match is known to be a value of about 100 MΩ, then the combined resistance corresponding to a match of a stored pattern and a target pattern determined by the twenty comparators 100 can be about 100 MΩ. If one of the comparators 100 determines a mismatch, and the resistance of the comparator 100 corresponding to a mismatch is known to be a value of about 10 KΩ, then the combined resistance can be about 9.98 KΩ.

An input 210 (such as voltage or current) to a sense amplifier 212 is based on the combined resistance of the comparators 100. Power consumption requirements, and correspondingly, thermal dissipation requirements of the check engine 200 may be reduced by using the single sense amplifier 212 to process the output 210 of multiple comparators 100, as compared to an architecture in which the output of each comparator is processed by a separate sense amplifier. In one embodiment, it is contemplated that the single sense amplifier 212 may process the output of 16, 32, 64, 128, or more comparators 100 in parallel. The single sense amplifier 212 may also process the output of N comparators 100 in parallel, where N is not a multiple of two. The sense amplifier 212 compares the input 210 to a reference 214, and sets the match output 216 based on the result of the comparison. Alternatively, the sense amplifier 212 may determine the combined resistance of the comparators 100 based on the input 210, and may compare this determined value of the combined resistance to the reference 214. For example, the match output 216 may be set to a high value if the input 210 is less than the reference 214, a low value if the input 210 is greater than the reference 214, and either the high value or the low value if the input 210 is equal to the reference 214. Alternatively, the match output 216 may be set to a low value if the input 210 is less than the reference 214, a high value if the input 210 is greater than the reference 214, and either the high value or the low value if the input 210 is equal to the reference 214.

In one embodiment, the reference 214 is configured to distinguish between a full match (match of all bits) of a stored pattern and a target pattern determined by the comparators 100, and a mismatch of the stored pattern and the target pattern in which any one of the comparators 100 determines a mismatch of at least one bit of the stored pattern and the target pattern. The reference 214 may be configured to a value between a first value of the input 210 corresponding to the full match and a second value of the input 210 corresponding to the mismatch determined by one of the comparators 100. In one embodiment, the reference 214 may be configured to a value halfway between the first value and the second value. Alternatively, if it is desired to reduce the probability of a false match indication, the reference 214 may be configured to a value closer to the second value. Alternatively, if it is desired to reduce the probability of a false mismatch indication, the reference 214 may be configured to a value closer to the first value.

Alternatively, the reference 214 may be configured such that a match is determined when not all of the bits of the target pattern match corresponding bits of the stored pattern, e.g., one or more bits of the target pattern does not match a corresponding one or more bits of the stored pattern.

The resistances of the comparators 100 can vary around a specified value due to factors such as manufacturing variations, environmental variations, and aging. Due to these variations, there is some uncertainty with regard to the combined resistance corresponding to a full match (or a mismatch) by a particular set of comparators 100. To more accurately determine the reference 214, the set of comparators 100 within the check engine 200 may be configured so that the comparators 100 have a combined resistance corresponding to a full match, and corresponding measurements of parameters such as the combined resistance and voltage and current based on the combined resistance may be made. This is known as self-referencing of the comparators 100 to a full matching configuration. Alternatively, the set of comparators 100 within the check engine 200 may be configured so that the comparators 100 have a combined resistance corresponding to a mismatch by a single comparator 100, and corresponding measurements of parameters such as the combined resistance and voltage and current based on the combined resistance may be made. This is known as self-referencing of the comparators 100 to a single comparator mismatch configuration.

In one embodiment, during self-referencing the combined resistance of the comparators 100 corresponding to at least one of a full match and a single comparator mismatch may be measured. Alternatively or in addition, the input 210 corresponding to this combined resistance of the comparators 100 may be measured. The reference 214 may be determined from at least one of the combined resistance of the comparators 100 corresponding to a full match and the input 210 corresponding to this combined resistance of the comparators 100.

In one embodiment, self-referencing of the comparators 100 can be performed when programming or configuring the check engine 1000, or on power up of the check engine 1000. In this embodiment, self-referencing is not performed as part of matching a target pattern to a stored pattern, so the matching still can occur in one cycle. Alternatively or in addition, self-referencing of the comparators 100 can be performed on the fly. For example, self-referencing of the comparators 100 can be performed in a separate cycle prior to matching a target pattern to a stored pattern, so that the matching (including the cycle for self-referencing) can take two cycles to complete. Alternatively or in addition, self-referencing of the comparators 100 can be performed periodically. In one embodiment, a measured value from the self-referencing of the comparators 100, such as a measured value of the combined resistance or a measured value of the input 210, can be latched into a sample-and-hold circuit so that the measured value is available for a pre-determined time period dependent on the design of the sample-and-hold circuit.

Alternatively, since the difference between the resistance of each comparator 100 including flash cells 102 for a match and for a mismatch is can be multiple orders of magnitude, the uncertainty in the combined resistance of the set of comparators 100 is typically significantly less than the difference between the combined resistance of the full matching configuration and the combined resistance of the single comparator mismatch configuration. Therefore, a value of the reference 214, such as about halfway between the combined resistance of the full matching configuration and the combined resistance of the single comparator mismatch configuration, can be selected without performing self-referencing of the set of comparators 100.

In one embodiment, ground terminals (shown as GND in FIG. 5) of the flash cells 102 may be connected in such a way as to thwart disconnection through laser or focused ion beam (FIB) cutting, and thereby to prevent a false "always match" condition for embodiments in which a high resistance value is presented by each of the comparators 100 for a match. For example, the ground terminals of the flash cells 102 may be connected with diffused (P+/N+) connections or other non-metal connections.

The architecture of FIG. 5 can be extended for the design of 32-bit, 64-bit, 128-bit, and higher bit serial architectures by including additional comparators along the input line, such as by including 32 comparators for a 32-bit design. However, the architecture of FIG. 5 is not limited to architectures for matching a number of bits that is a multiple of two. If a higher level of certainty is desired for a positive match, the number of bits to be checked concurrently can be set lower than when a lower level of certainty is sufficient. Depending upon the particular implementation, a large number of bits checked concurrently can have a lower level of certainty due to a degraded signal-to-noise ratio. For fingerprint recognition, as an example, a relatively large number of bits can be checked concurrently, since identifying a "perfect" match can be less important that other applications. In the case of checking electronic keys, a large key can be parsed and segmented into smaller increments that are separately checked to allow a higher level of certainty.

Figure 7:
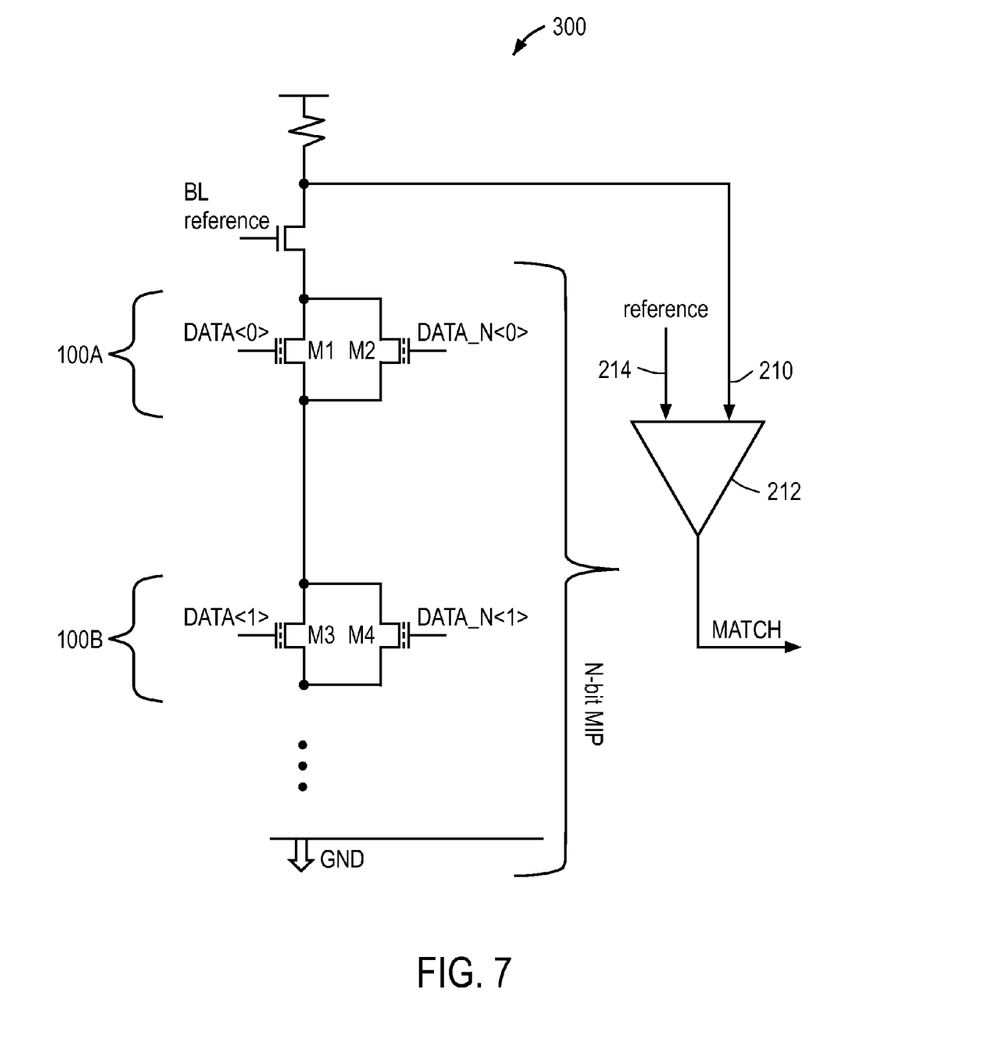
FIG. 7 illustrates a check engine including comparators connected in series, according to an embodiment of the invention.

FIG. 7 illustrates a check engine 300 including comparators 100 (100A and 100B shown) connected in series, according to an embodiment of the invention. The check engine 300 has a series architecture for match-in-place (MIP) applications. Characteristics of each comparator 100 have been described with reference to FIG. 4. The check engine 300 is in many respects similar to the check engine 1000 described with reference to FIG. 5, so aspects of the check engine 300 that are different are primarily discussed here.

As described previously with reference to FIG. 5, outputs of the comparators 100 can be combined to create a combined output. In the embodiment of FIG. 7, the resistances of the comparators 100 connected in series can be added to obtain a combined resistance. The input 210 (such as voltage or current) to the sense amplifier 212 is based on the combined resistance of the comparators 100.

In the embodiment of FIG. 7, a low resistance value (e.g., in the range from about 10 KΩ to 100 KΩ per comparator 100, though the resistance is not restricted to this value) can be presented for a match, and a high resistance value (e.g., about 100 MΩ, though the resistance is not restricted to this value) can be presented for a single comparator mismatch. In an illustrative example, if there are twenty comparators 300 connected in series and the resistance of each comparator 300 corresponding to a match is known to be a value of about 10 KΩ, then the combined resistance corresponding to a match of a stored pattern and a target pattern determined by the twenty comparators 300 can be about 200 K. If one of the comparators 300 determines a mismatch, and the resistance of the comparator 300 corresponding to a mismatch is known to be a value of about 100 MΩ, then the combined resistance can be about 100.19 MΩ.

Figure 8:
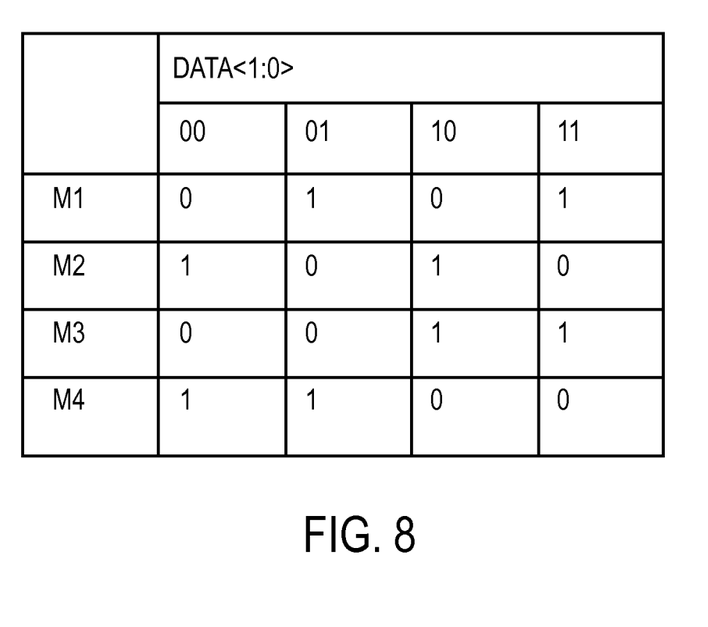
FIG. 8 illustrates matches between data stored in the check engine of FIG. 7 and target data, according to an embodiment of the invention.

FIG. 8 illustrates matches between data stored in the check engine 300 of FIG. 7 (such as M1, M2, M3, M4) and target data (such as DATA<1:0>), according to an embodiment of the invention. Each combination of DATA<0> and (M1, M2) shown in FIG. 8 corresponds to one of the flash cells 102 included in the comparator 100A being in its conductive state, and the other one of the flash cells 102 included in the comparator 100A being in its nonconductive state. Similarly, each combination of DATA<1> and (M3, M4) shown in FIG. 8 corresponds to one of the flash cells 102 included in the comparator 100B being in its conductive state, and the other one of the flash cells 102 included in the comparator 100B being in its nonconductive state.

In one embodiment, as described with reference to FIG. 5, self-referencing of the set of comparators 300 can be performed to at least one of a full match configuration and a single comparator mismatch configuration. Alternatively, as described with reference to FIG. 5, a value of the reference 214, such as about halfway between the combined resistance of the full matching configuration and the combined resistance of the single comparator mismatch configuration, can be selected without performing self-referencing of the set of comparators 300.

As compared to the embodiment of FIG. 5, the combined resistance of the comparators 100 in the check engine 300 is lower for a full match configuration, and higher for at least some mismatch configurations. The power consumption of the check engine 300 may correspondingly be higher or lower than that of the check engine 200, depending on the frequency of matches and mismatches. In many other respects, the check engine 300 operates similarly to the check engine 200.

To speed up operation of systems including multiple check engines such as the check engines 200 and 300, the processing associated with the match can be allocated across multiple check engines 200 and 300 in parallel.

Referring to FIGS. 5, 7, and 9 through 11, the comparators 502 may correspond to the comparators 100 and 600. In one embodiment, the generator 504 of the output of multiple comparators 502 may correspond to a device, such as electronic circuitry, electrically connected to each the comparators 100 and 600. The generator 504 may evaluate outputs of individual ones of the comparators 100 and 600. Alternatively, the generator 504 may aggregate (combine) outputs (such as voltage or current outputs) of the comparators 100 and 600. In one embodiment, the output 510 of the generator 504 may correspond to the input 210 to the sense amplifier 212 (see FIGS. 5 and 7), the match determiner 506 may correspond to the sense amplifier 212, the threshold 512 may correspond to the reference 214, and the match output 514 may correspond to the match output 216.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A check engine comprising:
    a plurality of comparators, each including a plurality of flash cells, wherein each of the plurality of comparators is configured to store at least one reference bit included in a set of reference bits defining a first pattern, and includes an input for presenting at least one target bit included in a set of target bits defining a second pattern;
    wherein each of the plurality of comparators is configured to produce an output representing a level of matching between the at least one target bit and the at least one reference bit; and
    wherein the check engine is configured such that the outputs of the plurality of comparators are combined to produce a combined output that is compared to a reference signal to determine whether there is match between the first pattern and the second pattern.

2. The check engine of claim 1, wherein at least one of the plurality of flash cells is a flash EEPROM cell.

3. The check engine of claim 1, wherein at least one of the plurality of flash cells is a flash EPROM cell.

4. The check engine of claim 1, wherein:
    the plurality of comparators are connected in series to produce the combined output; and
    the plurality of flash cells included in each of the plurality of comparators are connected in parallel.

5. The check engine of claim 1, wherein:
    the plurality of comparators are connected in parallel to produce the combined output; and
    the plurality of flash cells included in each of the plurality of comparators are connected in parallel.

6. The check engine of claim 1, wherein:
    the plurality of comparators are connected in parallel to produce the combined output; and
    the plurality of flash cells included in each of the plurality of comparators are connected in series.

7. The check engine of claim 1, wherein the output of each of the plurality of comparators represents a match between the at least one target bit and the at least one reference bit, the match corresponding to at least one of the plurality of flash cells being in an electrically conductive state.

8. The check engine of claim 1, wherein the output of each of the plurality of comparators represents a match between the at least one target bit and the at least one reference bit, the match corresponding to each of the plurality of flash cells being in a nonconductive state.

9. The check engine of claim 1, wherein:
    if the set of target bits matches the set of reference bits, the plurality of comparators has a first combined resistance;
    if the set of target bits does not match the set of reference bits, the plurality of comparators has a second combined resistance; and
    the second combined resistance is less than the first combined resistance.

10. The check engine of claim 9, wherein:
    if the set of target bits matches the set of reference bits, the plurality of comparators has a first combined resistance;
    if the set of target bits does not match the set of reference bits, the plurality of comparators has a second combined resistance; and
    the second combined resistance is greater than the first combined resistance.

11. The check engine of claim 1, wherein the reference signal is a predetermined value.

12. The check engine of claim 11, wherein the predetermined value corresponds to a self-referenced output of the plurality of comparators corresponding to a full matching configuration.

13. The check engine of claim 12, wherein the check engine is configured to determine the self-referenced output of the plurality of comparators in a separate cycle prior to determining that the set of target bits matches the set of reference bits.

14. A check engine comprising:
    a plurality of comparators, each including a plurality of flash cells, wherein the plurality of comparators is configured to store a plurality of reference bits defining a first pattern and to receive a plurality of target bits defining a second pattern, and wherein each of the plurality of comparators is configured to produce a first output based on a comparison of one or more of the plurality of reference bits and a corresponding one or more of the plurality of target bits;
    wherein the check engine is configured to determine a second output representing a level of matching between the plurality of target bits and the plurality of reference bits based on the first outputs of the plurality of comparators; and
    wherein the check engine is configured to determine a match between the first pattern and the second pattern by comparing the second output to a predetermined threshold.

15. The check engine of claim 14, wherein the check engine is configured to determine the predetermined threshold based on a self-referenced output of the plurality of comparators corresponding to a full matching configuration.

16. The check engine of claim 14, wherein the predetermined threshold is settable such that the match is determined when one or more of the plurality of target bits does not match a corresponding one or more of the plurality of reference bits.

17. The check engine of claim 14, wherein the second output represents a percentage of the plurality of target bits that match the plurality of reference bits.

18. A method of operating a check engine, comprising:
    providing a plurality of comparators in the check engine, each including a plurality of flash cells;
    storing at least one reference bit included in a set of reference bits in each of the plurality of comparators to establish a stored first pattern;
    presenting at least one target bit included in a set of target bits defining a second pattern to each of the plurality of comparators;
    generating an output at each of the plurality of comparators, the output representing a level of matching between the at least one target bit and the at least one reference bit;
    combining the outputs of the plurality of comparators to produce a combined output; and
    determining that the first pattern matches the second pattern based on the combined output of the plurality of comparators.

19. The method of claim 18, wherein:
    the plurality of comparators are connected in series to produce the combined output; and the plurality of flash cells included in each of the plurality of comparators are connected in parallel.

20. The method of claim 18, wherein:
the plurality of comparators are connected in parallel to produce the combined output; and
the plurality of flash cells included in each of the plurality of comparators are connected in parallel.

21. The method of claim 18, wherein the output of each of the plurality of comparators represents a match between the at least one target bit and the at least one reference bit, the match corresponding to at least one of the plurality of flash cells being in an electrically conductive state.

22. The method of claim 18, wherein the output of each of the plurality of comparators represents a match between the at least one target bit and the at least one reference bit, the match corresponding to each of the plurality of flash cells being in a nonconductive state.

23. The method of claim 18, wherein determining includes comparing the combined output of the plurality of comparators to a predetermined value.

* * * * *